United States Patent
Lin et al.

(10) Patent No.: US 6,391,719 B1
(45) Date of Patent: *May 21, 2002

(54) METHOD OF MANUFACTURE OF VERTICAL SPLIT GATE FLASH MEMORY DEVICE

(75) Inventors: Chrong Jung Lin, Hsin Tien; Shui-Hung Chen, Hsin-Chu; Di-Son Kuo, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/575,963

(22) Filed: May 23, 2000

Related U.S. Application Data

(62) Division of application No. 09/035,058, filed on Mar. 5, 1998, now Pat. No. 6,087,222.

(51) Int. Cl.⁷ .................................. H01L 21/336
(52) U.S. Cl. .................. 438/259; 438/270; 438/589
(58) Field of Search ........................... 438/257, 259, 438/268, 270, 289, 291, 589; 257/314, 315, 316

(56) References Cited

U.S. PATENT DOCUMENTS

| | | | |
|---|---|---|---|
| 5,108,938 A | 4/1992 | Solomon | 437/41 |
| 5,229,310 A | 7/1993 | Sivan | 437/41 |
| 5,312,767 A | 5/1994 | Shimizu et al. | 437/40 |
| 5,391,506 A | 2/1995 | Tada et al. | 437/41 |
| 5,786,612 A * | 7/1998 | Otani et al. | 257/316 |
| 5,998,261 A * | 12/1999 | Hofmann et al. | 438/257 |
| 6,008,089 A * | 12/1999 | Hong | 438/259 |
| 6,087,222 A * | 7/2000 | Jung Lin et al. | 438/259 |
| 6,124,608 A * | 9/2000 | Liu et al. | 257/315 |

FOREIGN PATENT DOCUMENTS

EP   0485018 A2  *  5/1992

* cited by examiner

Primary Examiner—Olik Chaudhuri
Assistant Examiner—Hoai Pham
(74) Attorney, Agent, or Firm—George O. Saile; Stephen B. Ackerman; Graham S. Jones, II

(57) ABSTRACT

A method of forming a vertical transistor memory device includes the following steps. Before forming the trenches, FOX regions are formed between the rows. Form a set of trenches with sidewalls and a bottom in a semiconductor substrate with threshold implant regions the sidewalls. Form doped drain regions near the surface of the substrate and doped source regions in the base of the device below the trenches with oppositely doped channel regions therebetween. Form a tunnel oxide layer over the substrate including the trenches. Form a blanket thick floating gate layer of doped polysilicon over the tunnel oxide layer filling the trenches and extending above the trenches. Etch the floating gate layer down below the top of the trenches. Form an interelectrode dielectric layer composed of ONO over the floating gate layer and over the tunnel oxide layer. Form a blanket thick control gate layer of doped polysilicon over the interelectrode dielectric layer. Pattern the control gate layer into control gate electrodes. Form spacers adjacent to the sidewalls of the control gate electrode.

16 Claims, 6 Drawing Sheets

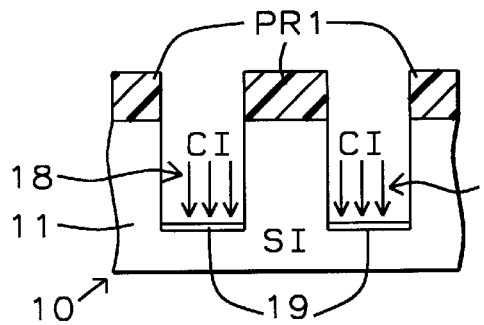
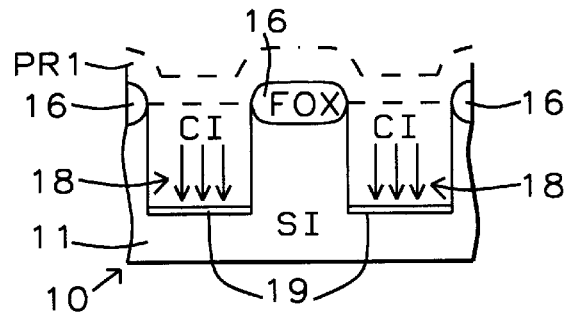
FIG. 1E    FIG. 2E
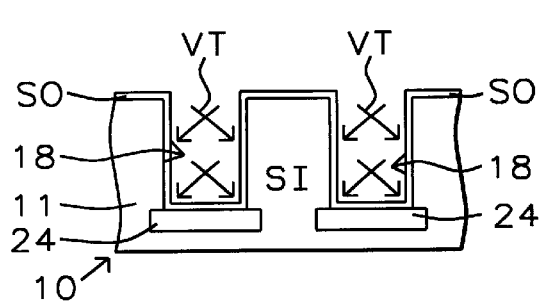
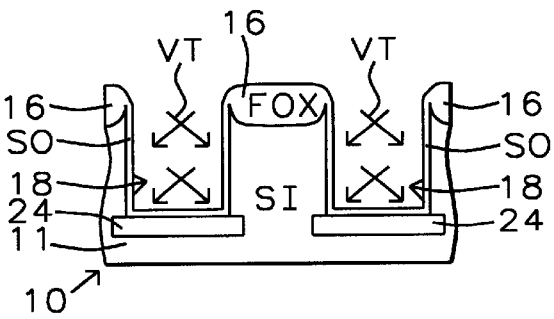
FIG. 1F    FIG. 2F
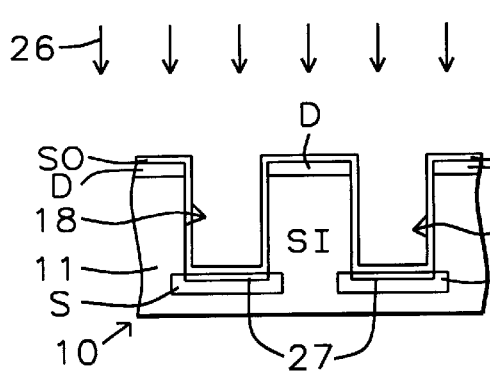
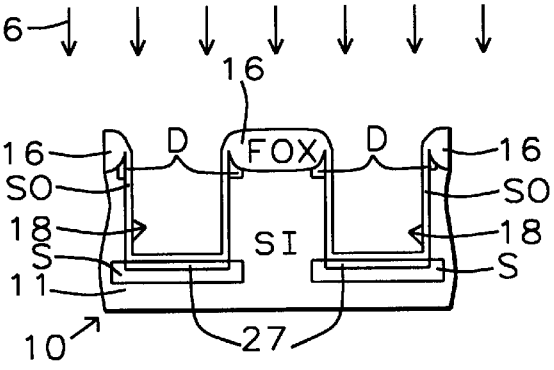
FIG. 1G    FIG. 2G

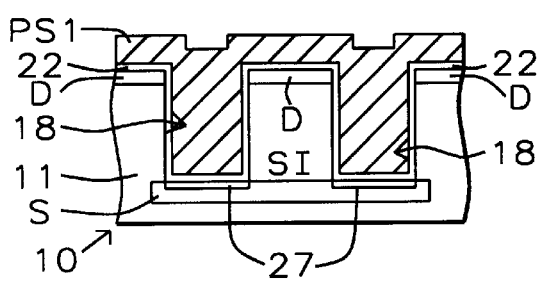
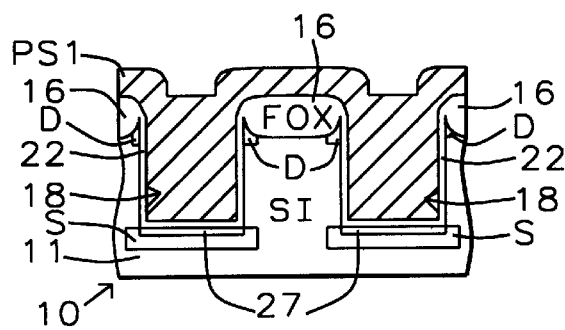
FIG. 1H  FIG. 2H
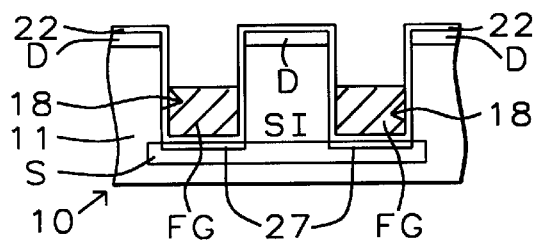
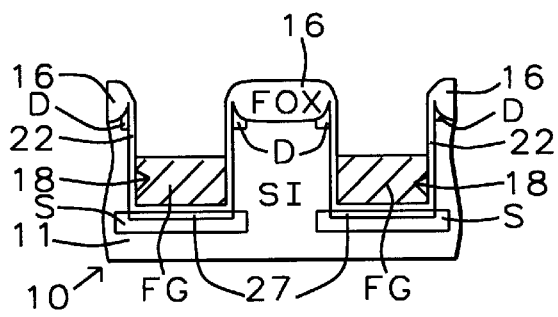
FIG. 1I  FIG. 2I
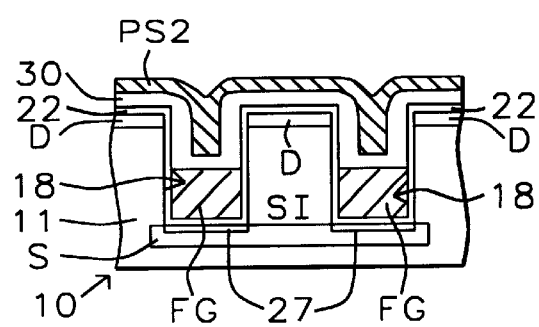
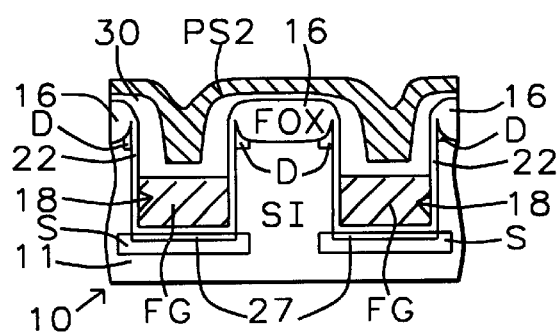
FIG. 1J  FIG. 2J

METHOD OF MANUFACTURE OF VERTICAL SPLIT GATE FLASH MEMORY DEVICE

This is a division of patent application Ser. No. 09/035,058, filing date Mar. 5, 1998, now U.S. Pat. No. 6,087,222 Method Of Manufacture Of Vertical Split Gate Flash Memory Device And Device Manufactured Thereby, assigned to the same assignee as the present invention.

BACKGROUND OF THE INVENTION

1. Field of the Invention

This invention relates to the manufacture of semiconductor memory devices and more particularly to a method of manufacture of vertical FET devices formed in trenches in a semiconductor substrate and the devices formed thereby.

2. Description of Related Art

Currently, split gate flash memory devices have a misalignment problem and scaling down issues.

U.S. Pat. No. 5,108,938 of Solomon for "Method of Making a Trench Gate Complimentary Metal Oxide Semiconductor Transistor" shows a FET (Field Effect Transistor) with the source (S) and drain (D) regions on the substrate surface separated by a trench.

U.S. Pat. No. 5,391,506 of Tada et al. for "Manufacturing Method for Semiconductor Devices with Source/Drain Formed in Substrate Projection" shows a method for semiconductor devices with source/drain formed in substrate projection. A projection is formed in a substrate by anisotropic etching and a transistor is contained in the projection. The central portion of the projection covered with a gate electrode is formed as a channel region, and drain and source regions are formed on both sides of the projection by oblique ion implantation with the gate electrode as a mask. However, this reference differs from the configuration of the invention's split gate Flash with the source region at the bottom of the trench and the drain at the substrate surface.

U.S. Pat. No. 5,312,767 of Shimizu et al. for "MOS Type Field Effect Transistor and Manufacturing Method Thereof" shows a vertical SOI (Silicon On Insulator) transistor that has the source S and D regions on opposite ends of a trench. However the device is not a Flash memory.

U.S. Pat. No. 5,229,310 of Sivan "Method of Making a Self-Aligned Vertical Thin-Film Transistor in a Semiconductor Device" shows an EEPROM with a vertical orientation in a trench.

SUMMARY OF THE INVENTION

Objects of this invention are as follows:
1. Scaling down the size of split gate flash memory devices.
2. Providing devices without a misalignment issue for the polysilicon 1 layer and the polysilicon 2 mask.
3. The cell area can be compared with stacked gate flash memory.

A vertical, split gate, flash memory device in accordance with this invention has the features as follows:
1. Small cell area;
2. No misalignment;
3. high channel current.

In accordance with this invention a method is provided for forming a vertical transistor memory device includes the following steps. Before forming the trenches, FOX regions are formed between the rows. Form a set of trenches with sidewalls and a bottom in a semiconductor substrate with threshold implant regions the sidewalls. Form doped drain regions near the surface of the substrate and doped source regions in the base of the device below the trenches with oppositely doped channel regions therebetween. Form a tunnel oxide layer over the substrate including the trenches. Form a blanket thick floating gate layer of doped polysilicon over the tunnel oxide layer filling the trenches and extending above the trenches. Etch the floating gate layer down below the top of the trenches. Form an interelectrode dielectric layer composed of ONO over the floating gate layer and over the tunnel oxide layer. Form a blanket thick control gate layer of doped polysilicon over the interelectrode dielectric layer. Pattern the control gate layer into control gate electrodes. Form spacers adjacent to the sidewalls of the control gate electrode.

BRIEF DESCRIPTION OF THE DRAWINGS

The foregoing and other aspects and advantages of this invention are explained and described below with reference to the accompanying drawings, in which:

FIGS. 1A–1L show sectional elevational views of a device in accordance with this invention, taken along line 4–4' in FIG. 3, of various stages of the manufacturing process for producing a device in accordance with this invention.

FIGS. 2A–2L show sectional elevational views of a device in accordance with this invention, taken along line 5–5' in FIG. 3, of various stages of the manufacturing process for producing a device in accordance with this invention.

DESCRIPTION OF THE PREFERRED EMBODIMENT

Figure 3:
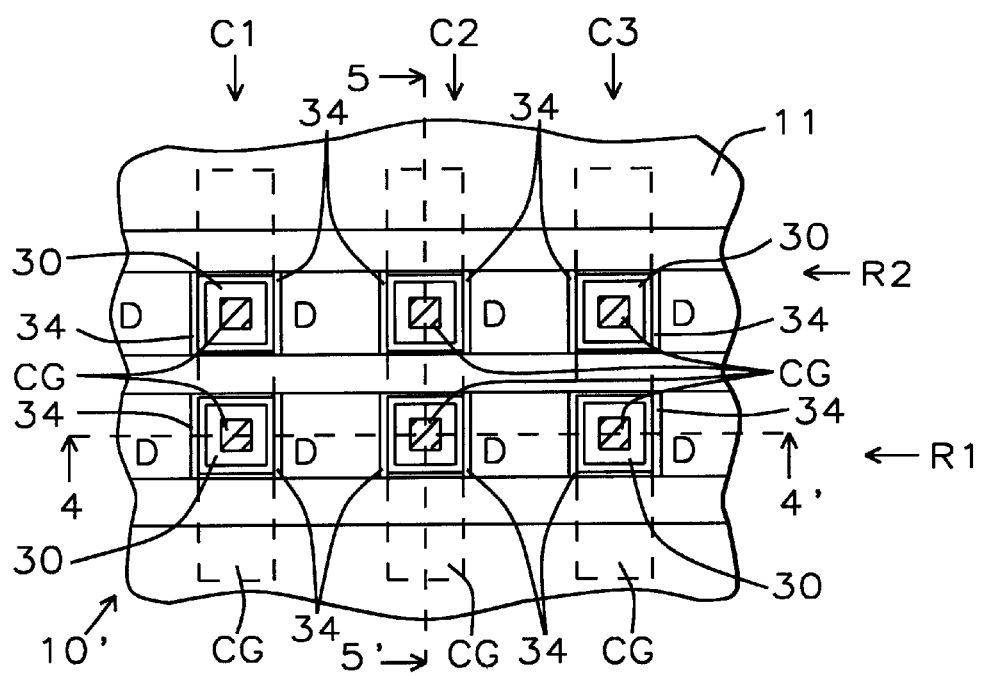
FIG. 3 shows a plan sectional view of the device of FIGS. 1L and 2L as well as FIGS. 4 and 5 taken along line 3–3' in FIG. 4.

FIGS. 1A–1L show sectional elevations of a device 10 in accordance with this invention, taken along line 4–4' in FIG. 3, of various stages of the manufacturing process for producing a device in accordance with this invention.

FIGS. 2A–2L show sectional elevations of a device 10 in accordance with this invention, taken along line 5–5' in FIG. 3, of various stages of the manufacturing process for producing a device in accordance with this invention.

Figure 1A:
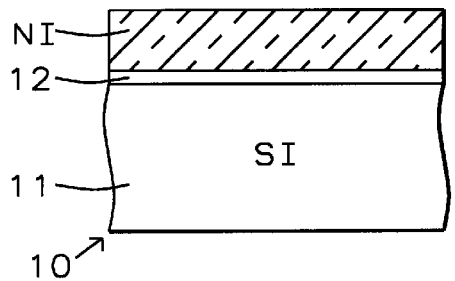
Figure 2A:
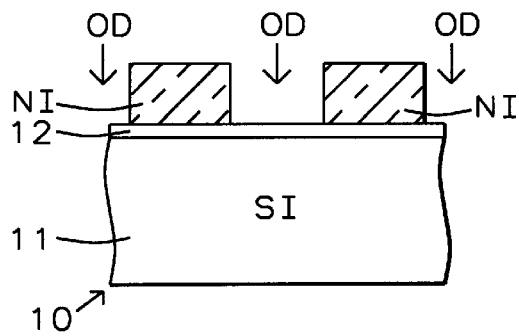

FIGS. 1A and 2A show the device 10 after the first and second steps of the process.

1. Wafer Start

The first step is the "wafer start step" in which a silicon semiconductor substrate 11 is provided.

2. Active Area Definition

The second step is definition of the "active area (OD) in a Pad oxide/Nitride Deposition step in which a thin pad oxide layer 12 and a silicon nitride mask NI with OD openings therethrough have been applied to substrate 11.

3. Field Oxidation

Figure 1B:
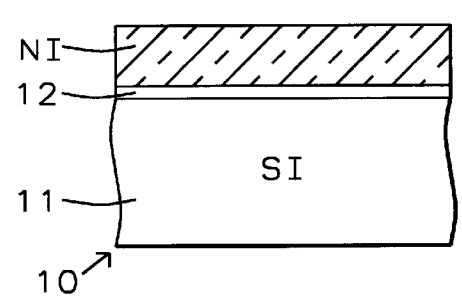
Figure 2B:
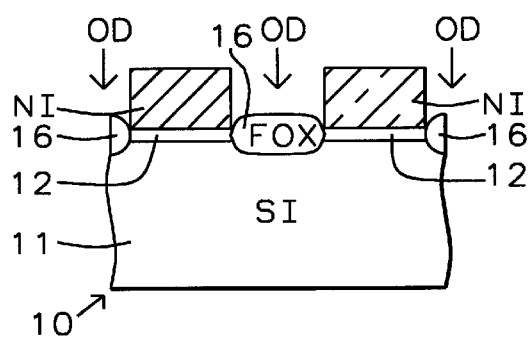

FIGS. 1B and 2B show the device 10 after the third step in which a conventional field oxidation process has formed the FOX (Field OXide) regions 16 have been formed, as shown in FIG. 2B.

4. Stripping Nitride Mask and Pad Oxide Layer

Figure 1C:
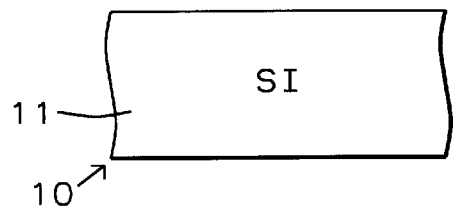
Figure 2C:
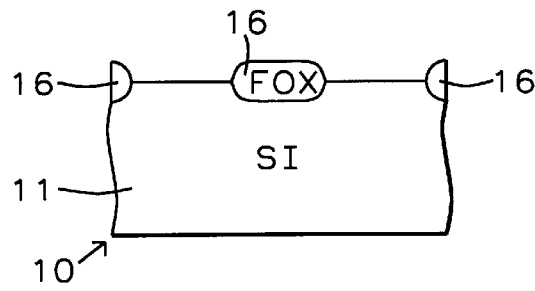

FIGS. 1C and 2C show the device 10 after the fourth step in which the silicon nitride mask NI has been stripped from device 10. In addition, in this step, the pad oxide layer 12 has been stripped from device 10.

5. Trench Channel Etch

Figure 1D:
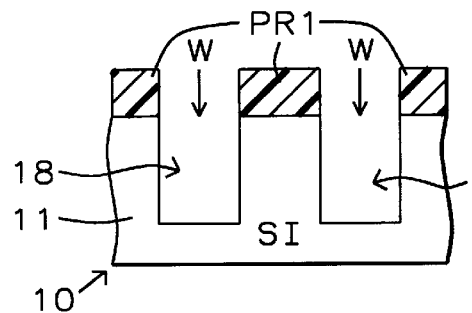
Figure 2D:
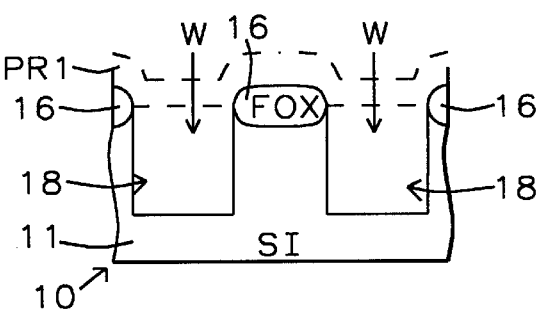

FIGS. 1D and 2D show the device 10 after the fifth step in which a photoresist trench mask PR1 has been formed over device 10 including the FOX regions 16 and the exposed surfaces of substrate 11. Mask PR1 has a set of windows W therethrough down to the top surface of substrate 11. Windows W were then used to etch trenches 18 deep into the substrate 11 to a depth of from about 4,000 Å to about 9,000 Å. Trenches 18 have a width from about 3,000 Å to about 10,000 Å across the page and a length from about 3,000 Å to about 10,000 Å extending back into the page. Vertical transistors will be formed in the trenches 18. The trenches 18 are etched by a dry process such as RIE (Reactive Ion Etching) or plasma etching.

6. Source Connection Region Implant

FIGS. 1E and 2E show the device 10 after the sixth step in which P type dopant CI is implanted, in an anisotropic substantially vertical implant, into the base regions 19 of the trenches 18 to provide a source connection implant.

The phosphorus source connection region 19 was ion implanted into the base regions 19 of phosphorus type dopant with a dose from about 1 E 14 ions/cm$^2$ to about 1 E 15 ions/cm$^2$ at an energy from about 20 keV to about 60 keV. After annealing the concentration of phosphorus dopant in the source connection region 19 was from about 1 E 19 atoms/cm$^3$ to about 4 E 20 atoms/cm$^3$.

7. Sacrificial Oxide

Referring to FIGS. 1F and 2F, device 10 is shown after a SAC (Sacrificial) oxide layer SO was formed over the exposed surfaces of silicon substrate 11, aside from FOX regions 16, covering the substrate 11 and the sidewalls and bottom of the trenches 18 with a thin silicon oxide film with a thickness from about 100 Å to about 250 Å.

8. Threshold Voltage Implant

Referring again to FIGS. 1F and 2F, following formation of the SAC layer SO, a Vth (Threshold Voltage) rotary oblique angular ion implant of boron difluoride BF$_2$ P type dopant is for the channel regions of the FET devices to be formed is implanted in the exposed surfaces of the substrate 10, especially including the sidewalls of the trenches 18. The FOX regions 16 in FIG. 2F prevent ion implantation into the surfaces the substrate 11 below them.

The sidewalls of the trenches 18 in substrate 11 were ion implanted at an oblique angle with a dose of BF$_2$ dopant from about 1 E 12 ions/cm$^2$ to about 7 E 13 ions/cm$^2$ at an energy from about 15 keV to about 45 keV. After annealing the concentration of the boron dopant in the sidewalls of the substrate 11 was from about 8 E 16 atoms/cm$^3$ to about 8 E 17 atoms/cm$^3$. As a result, P type dopant has formed regions 24 in the substrate 11 where source regions S will be formed later with implanted N type dopant as shown in FIGS. 1G and 2G.

9. Source/Drain Implant

Referring to FIGS. 1G and 2G, source/drain (S/D) regions S and D are formed by ion implanting N type dopant in an anisotropic substantially vertical implant into the exposed surfaces of substrate 11 aside from the FOX regions 16. Again, the FOX regions 16 in FIG. 2G prevent ion implantation into the surfaces the substrate 11 below them.

The source/drain regions S and D were ion implanted with a dose of arsenic, phosphorus or antimony N type dopant from about 5 E 14 ions/cm$^2$ to about 5 E 15 ions/cm$^2$ at an energy from about 20 keV to about 45 keV. After annealing the concentration of arsenic, phosphorus or antimony N type dopant in the source/drain regions S/D were from about 5 E 19 atoms/cm$^3$ to about 5 E 20 atoms/cm$^3$.

The connect regions 27 are shown at the base of the trenches below the sacrificial oxide layer SO.

10. Stripping Sacrificial Oxide Layer

Referring to FIGS. 1H and 2H, the next step is to strip the sacrificial oxide layer SO from the device 11.

11. Tunnel Oxide

Referring again to FIGS. 1H and 2H, device 10 is shown after a tunnel oxide layer 22 was formed over the exposed surfaces of silicon substrate 11 regions 16, aside from FOX regions covering the substrate 11 and the sidewalls and bottom of the trenches 18 with a thin silicon oxide film with a thickness from about 70 Å to about 150 Å.

The connect regions 27 are shown at the base of the trenches below the tunnel oxide layer 22.

12. Floating Polysilicon Deposition

Referring once more to FIGS. 1H and 2H, device 10 is shown after a first polysilicon layer PS1 was formed over the device 10 on substrate 11 covering the tunnel oxide layer 22 and FOX regions 16 and filling trenches 18. The first polysilicon layer PS1 has a thickness from about 1,000 Å to about 4,000 Å. The polysilicon layer PS1 is doped with a conventional dopant to provide electrical conductivity as is conventional with polysilicon metallization.

13. Floating Polysilicon Etch

Referring to FIGS. 1I and 2I, device 10 is shown after the first polysilicon layer PS1 has been etched by RIE or plasma etching until layer PS1 is lowered down to well below the top of the trenches 18, with all of layer PS1 removed from the surface of substrate 11 and FOX regions 16. As can be seen in FIGS. 1I and 2I, the layer PS1 fills about half of the depth of trenches 18 and the new structures created by the etching are floating gates FG formed from what remains of the first polysilicon layer PS1.

14. Intergate Dielectric Deposition

Referring once more to FIGS. 1I and 2I, device 10 is shown after formation of a dilectric layer 30 which is preferably an ONO (Oxide/Nitride/Oxide) layer. In that case layer 30 comprises thin layers of SiO/Si$_3$N$_4$/SiO forming a set of intergate (interpolysilicon) dielectric structures 30 with an overall thickness from about 120 Å to about 250 Å. The ONO layer 30 can be formed by the process steps as follows:

O Thermal oxide thickness of about 80 Å to about 150 Å 900 to 1000° C.,

N Nitride by LPCVD at 700–800° C. thickness of about 100 Å to about 150 Å,

O thermal oxidation or CVD thickness of about 20–50 Å at about 900° C. for 10 minutes.

15. Control Polysilicon Deposition

Referring once more to FIGS. 1J and 2J, device 10 is shown after a second polysilicon layer PS2 was formed over the device 11 covering the interpolysilicon layer 30 nearly filling trenches 18 to provide a layer to be patterned into the control gate electrodes of the device 10. The second polysilicon layer PS2 has a thickness from about 1,500 Å to about 3,000 Å. The polysilicon layer PS2 is doped with a conventional dopant to provide electrical conductivity as is conventional with polysilicon metallization.

16. Control Polysilicon Mask

Figure 1K:
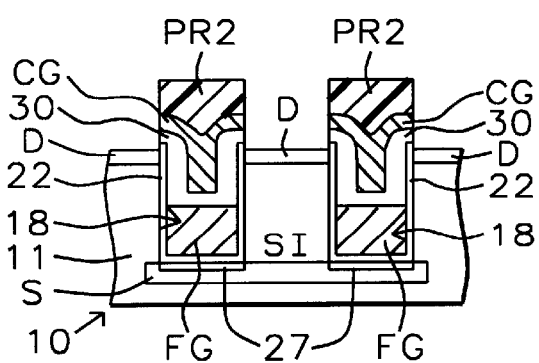
Figure 2K:
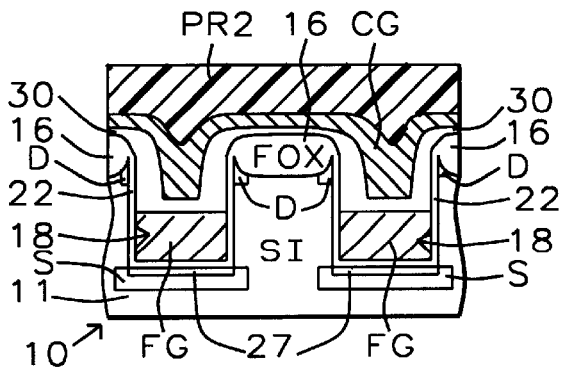

Referring to FIGS. 1K and 2K, device 10 is shown after formation of control gate mask PR2.

17. Control Polysilicon Etch

Referring to FIGS. 1K and 2K, device 10 is shown after the second polysilicon layer PS2 has been etched by RIE or plasma etching until layer PS2 has been patterned in the pattern of mask PR2 into the control gate electrodes CG.

18. Control Polysilicon Mask

Figure 1L:
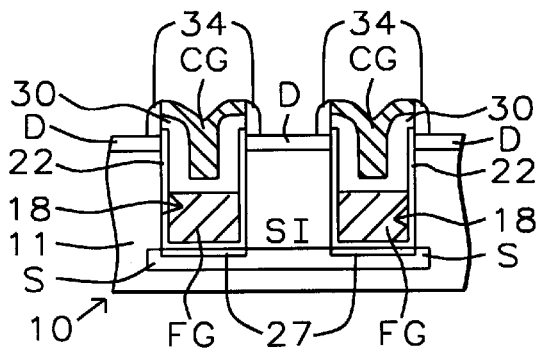
Figure 2L:
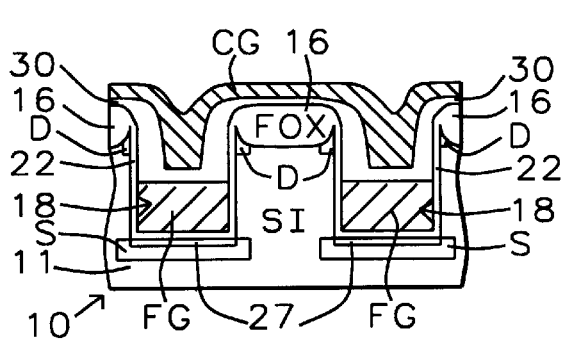

Referring to FIGS. 1L and 2L, device 10 is shown after stripping of control gate mask PR2 leaving the control gate electrodes CG exposed.

19. Spacer Glass Deposition

Then again referring to FIGS. 1L and 2L, a spacer glass layer 34 is formed over the entire device 10 covering the drain regions D, the exposed sidewalls of the ONO layer 30 and the control gates CG. A conventional TEOS process can be employed to form the glass spacer layer.

20. Spacer Etch

Finally, the spacer layer 34 is etched back to form the spacers 34 adjacent to the sidewalls of the ONO layer 20 and the control gate electrodes CG in the conventional manner.

Figure 4:
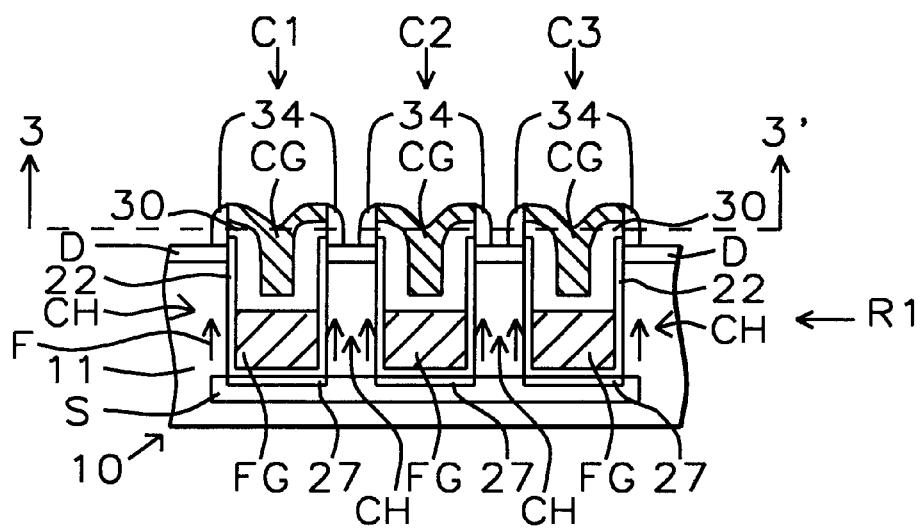
FIG. 4 shows a sectional view of the device of FIG. 3 taken along line 4–4' in FIG. 3 showing the flow through the channel region between the source region and the drain regions.
Figure 5:
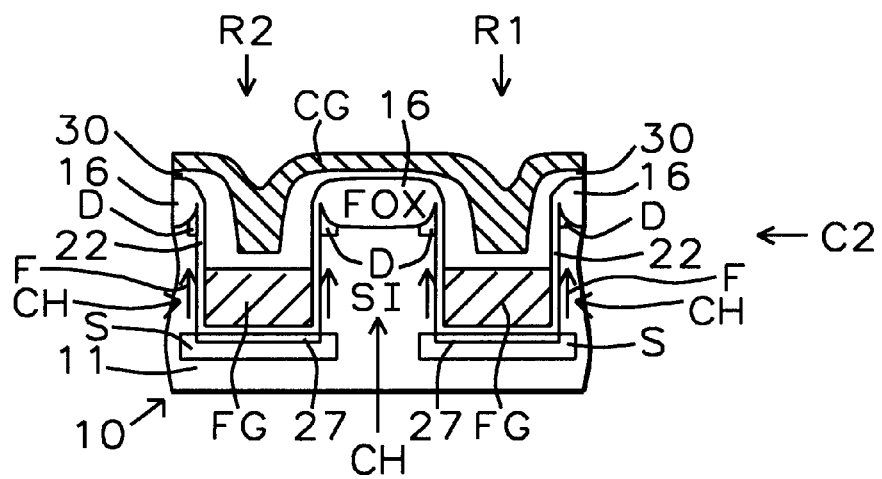
FIG. 5 shows a sectional view of the device 10 of FIG. 3 taken along line 5–5' in FIG. 3 showing the flow through the channel region between the source region and the drain regions with a control gate bridging across a column from row to row.

FIG. 3 shows a plan sectional view of the device 10 of FIGS. 1L and 2L as well as FIGS. 4 and 5 taken along line 3–3' in FIG. 4. Two horizontal rows R1 and R2 of three FET devices each are shown in three vertical columns C1, C2 and C3 with drain regions D located between the trenches indicated by the nested squares in the center square of which are the sections of the control gates CG surrounded by the ONO regions 30. Extending vertically are the portions of the control gates CG which are shown in phantom as they have been cut away by the section which looks below the surface of the device 10 with the tops of the control gates cut away to shown the ONO layers, etc. The spacers 34 are shown on the sidewalls of the control gates CG.

FIG. 4 shows a sectional view of the device 10 of FIG. 3 taken along line 4–4' in FIG. 3 showing the flow F through the channel region CH between the source region S and the drain regions D. It can be seen that there is a single buried source line S extending along between the three FET devices in row R1. There is a parallel source line S extending along between the three FET devices in row R2.

FIG. 5 shows a sectional view of the device 10 of FIG. 3 taken along line 5–5' in FIG. 3 showing the slow F through the channel region CH between the source region S and the drain regions D with the control gate CG bridging across the column C2 from row R2 to row R1.

For the operation modes, source-side injection programming is employed. FN (Fowler Nordheim) tunneling erase used and reading is also done. The operation conditions of the memory cell are listed in Table I below.

TABLE I

|  | $V_S$ | $V_D$ | $V_{CG}$ | $V_B$ |
|---|---|---|---|---|
| Program | +6V ~ +10V | +0.5V ~ +1.5V | +1.5V ~ +3.3V | 0V |
| Erase | +2V ~ +6V | FLOATING | −8V ~ −14V | 0V |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a vertical transistor FET memory device comprising:

forming a set of trenches each having a trench sidewalls and a trench bottom in a semiconductor substrate, forming threshold implant regions formed within said trench sidewalls, forming doped drain regions near the surface of said substrate and doped source regions in the base of said device below said trenches with oppositely doped channel regions therebetween, forming a tunnel oxide layer over said substrate including said trenches, forming a blanket thick floating gate layer of doped polysilicon over said tunnel oxide layer filling said trenches and extending above said trenches, etching said floating gate layer down below the top of said trenches, forming an interelectrode dielectric layer over said floating gate layer and over said tunnel oxide layer, forming a blanket thick control gate layer of doped polysilicon over said interelectrode dielectric layer, and patterning said control gate layer.

2. A method in accordance with claim 1 wherein:

prior to forming said threshold implant regions formed within said trench sidewalls, a source connect implant is formed in the bottoms of said trenches.

3. A method in accordance with claim 1 wherein:

an array of FET cells is formed in rows and columns, with the rows being orthogonally arranged with respect to the columns with the cells in a single row having a common source region and the cells in a columns having separate source regions.

4. A method in accordance with claim 1 wherein:

prior to forming said threshold implant regions formed within said trench sidewalls, a source connect implant is formed in the bottoms of said trenches, and an array of FET cells is formed in rows and columns, with the rows being orthogonally arranged with respect to the columns with the cells in a single row having a common source region and the cells in a columns having separate source regions.

5. A method in accordance with claim 1 wherein:

before forming said trenches, FOX regions are formed between said rows.

6. A method in accordance with claim 1 wherein:

before forming said trenches, FOX regions are formed between said rows, prior to forming said threshold implant regions formed within said trench sidewalls, a source connect implant is formed in the bottoms of said trenches.

7. A method in accordance with claim 1 wherein:

before forming said trenches, FOX regions are formed between said rows, an array of FET cells is formed in rows and columns, with the rows being orthogonally arranged with respect to the columns with the cells in a single row having a common source region and the cells in a columns having separate source regions.

8. A method in accordance with claim 1 wherein:

before forming said trenches, FOX regions are formed between said rows, prior to forming said threshold implant regions formed within said trench sidewalls, a source connect implant is formed in the bottoms of said trenches, and an array of FET cells is formed in roles and columns, with the rows being orthogonally arranged with respect to the columns with the cells in a single row having a common source region and the cells in a columns having separate source regions.

9. A method of forming a vertical transistor memory device comprising:

before forming said trenches, FOX regions are formed between said rows, forming a set of trenches with sidewalls and a bottom in a semiconductor substrate with threshold implant regions said sidewalls, forming doped drain regions near the surface of said substrate and doped source regions in the base of said device below said trenches with oppositely doped channel regions therebetween, forming a tunnel oxide layer over said substrate including said trenches, forming a blanket thick floating gate layer of doped polysilicon over said tunnel oxide layer filling said trenches and extending above said trenches, etching said floating gate layer down below the top of said trenches, forming an interelectrode dielectric layer composed of ONO over said floating gate layer and over said tunnel oxide layer, forming a blanket thick control gate layer of doped polysilicon over said interelectrode dielectric layer, patterning said control gate layer into control gate electrodes, and forming spacers adjacent to the sidewalls of said control gate electrode.

10. A method in accordance with claim 9 wherein:

prior to forming said threshold implant regions formed within said trench sidewalls, a source connect implant is formed in the bottoms of said trenches.

11. A method in accordance with claim 9 wherein:

an array of FET cells is formed in rows and columns, with the rows being orthogonally arranged with respect to the columns with the cells in a single row having a common source region and the cells in a columns having separate source regions.

12. A method in accordance with claim 9 wherein:

prior to forming said threshold implant regions formed within said trench sidewalls, a source connect implant is formed in the bottoms of said trenches, and an array of FET cells is formed in rows and columns, with the rows being orthogonally arranged with respect to the columns with the cells in a single row having a common source region and the cells in a columns having separate source regions.

13. A method in accordance with claim 9 wherein:

before forming said trenches, FOX regions are formed between said rows.

14. A method in accordance with claim 9 wherein:

before forming said trenches, FOX regions are formed between said rows, prior to forming said threshold implant regions formed within said trench sidewalls, a source connect implant is formed in the bottoms of said trenches.

15. A method in accordance with claim 9 wherein:

before forming said trenches, FOX regions are formed between said rows, an array of FET cells is formed in rows and columns, with the rows being orthogonally arranged with respect to the columns with the cells in a single row having a common source region and the cells in a columns having separate source regions.

16. A method in accordance with claim 9 wherein:

before forming said trenches, FOX regions are formed between said rows, prior to forming said threshold implant regions formed within said trench sidewalls, a source connect implant is formed in the bottoms of said trenches, and an array of FET cells is formed in rows and columns, with the rows being orthogonally arranged with respect to the columns with the cells in a single row having a common source region and the cells in a columns having separate source regions.

\* \* \* \* \*